United States Patent [19]

Parthasarathi

[11] Patent Number: 4,552,627
[45] Date of Patent: Nov. 12, 1985

[54] PREPARATION FOR IMPROVING THE ADHESION PROPERTIES OF METAL FOILS

[75] Inventor: Arvind Parthasarathi, Hamden, Conn.

[73] Assignee: Olin Corporation, New Haven, Conn.

[21] Appl. No.: 670,239

[22] Filed: Nov. 13, 1984

[51] Int. Cl.[4] .................. C25D 5/34; C25D 17/00
[52] U.S. Cl. ............................. 204/27; 204/28; 204/29; 204/207
[58] Field of Search ............ 204/15, 27, 28, 32.1, 204/38.1, 37.6, 38.3, 40, 42, 206, 207, 29

[56] References Cited

U.S. PATENT DOCUMENTS

| | | | |
|---|---|---|---|
| Re. 30,180 | 12/1979 | Wolski et al. | 428/601 |
| 3,094,469 | 7/1959 | Strauss et al. | 204/141.5 |
| 3,107,197 | 10/1963 | Stein et al. | 428/422 |
| 3,114,683 | 12/1963 | Chorney | 204/28 |
| 3,220,897 | 11/1965 | Conley et al. | 428/606 |
| 3,293,109 | 12/1966 | Luce et al. | 428/606 |
| 3,322,656 | 5/1967 | Dahringer et al. | 204/38 A |
| 3,328,275 | 6/1967 | Waterbury | 204/38 |
| 3,518,168 | 6/1970 | Byler et al. | 204/32 |
| 3,585,010 | 6/1971 | Luce et al. | 204/44 |
| 3,671,407 | 6/1972 | Hamilton et al. | 204/32.1 |
| 3,699,013 | 10/1972 | Carlson | 204/27 |
| 3,838,022 | 9/1974 | Bartolini et al. | 204/32.1 |
| 3,857,681 | 12/1974 | Yates et al. | 204/27 |
| 3,918,926 | 11/1975 | Wolski et al. | 204/40 |
| 4,010,086 | 1/1977 | Barrett et al. | 204/141.5 |
| 4,039,410 | 8/1977 | Davidoff | 204/141.5 |
| 4,049,481 | 9/1977 | Morisaki | 156/151 |
| 4,053,370 | 10/1977 | Yamashita et al. | 204/13 |
| 4,073,699 | 2/1978 | Hutkin | 204/13 |
| 4,131,517 | 12/1978 | Mitsuo et al. | 204/27 |
| 4,468,293 | 8/1984 | Polan et al. | 204/27 |

FOREIGN PATENT DOCUMENTS

| | | | |
|---|---|---|---|
| 1371510 | 10/1964 | France | 204/15 |
| 112145 | 3/1975 | German Democratic Rep. | 204/27 |
| 134785 | 3/1979 | German Democratic Rep. | 204/27 |
| 1515361 | 6/1978 | United Kingdom | 204/15 |
| 2030176A | 4/1980 | United Kingdom | 204/27 |

OTHER PUBLICATIONS

Technologien Und Zpezialausrustungen Zur Erzeugung Und Nachbehandlung Von Kupferfolien, by W. Burkhart, *Metal*, Aug. 1978, pp. 791–793.

*Primary Examiner*—T. M. Tufariello
*Attorney, Agent, or Firm*—Barry L. Kelmachter; Howard M. Cohn; Paul Weinstein

[57] ABSTRACT

The present invention relates to a technique for improving the adhesive properties of a metal or metal alloy material by reducing the number of bare spots and unplated regions on each treated surface of the metal or metal alloy material. The technique comprises electrolytically forming a substantially uniform metal oxide layer on at least one surface of the material, chemically converting the oxide layer into a substantially uniform layer of fresh metal, and thereafter electrolytically forming a plurality of dendritic structures on the at least one surface. The technique of the present invention has particular utility in improving the adhesive properties of wrought copper and copper alloy foils. An apparatus for performing the technique is also described.

19 Claims, 1 Drawing Figure

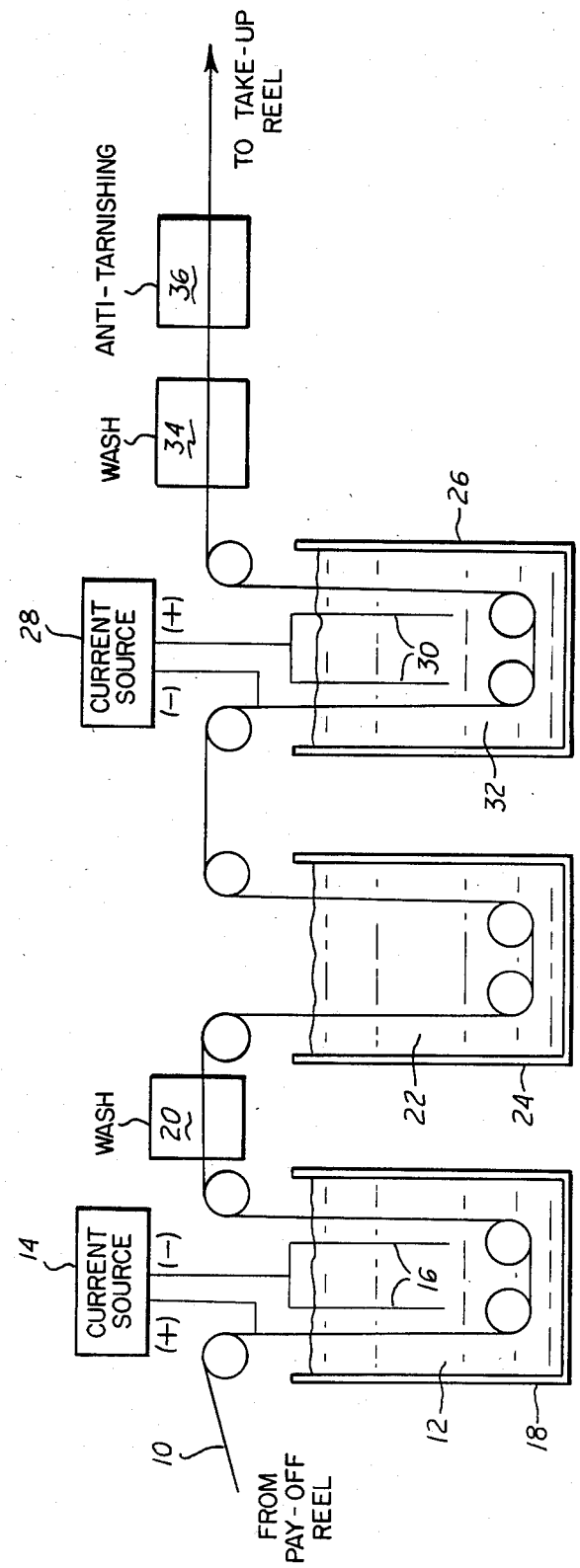

PREPARATION FOR IMPROVING THE ADHESION PROPERTIES OF METAL FOILS

The present invention relates to a method and apparatus for improving the adhesion properties of metal sheet, strip or foil. More particularly, wrought metal or metal alloy sheet, strip or foil is treated to improve its ability to adhere to a substrate material.

Copper and copper alloys have been a material of choice in electrical and electronic applications such as printed circuits because of their electrical conductivity properties. During the production of printed circuits, copper or copper alloy foil is typically bonded to a substrate material, generally a synthetic polymer, with an adhesive. Thereafter, the composite structure is subjected to an acid etching treatment to form a desired circuit. Because the adhesion between bare copper and copper alloy foils and most substrate materials used today tends to be weak, considerable effort has been spent on the development of techniques for improving the adhesive properties of copper and copper alloy foils.

Early techniques for improving adhesion generally comprised forming an adherent oxide layer on the copper or copper alloy foil surface to be bonded to the substrate material. The oxide layer was typically formed by treating the copper or copper alloy foil with an aqueous alkaline oxidizing solution. Both chemical and electrolytic treatments were used. U.S. Pat. Nos. 3,107,197 to Stein et al. and 3,114,683 to Chorney illustrate some of these early treatments. In one such treatment, a sheet of copper with an anodically produced adherent oxide coating was drawn through a NaOH bath and cathodically polarized to reduce the oxide coating to metallic copper. Prior to being laminated to the substrate material, a layer of tin or a tin alloy was deposited on the copper. French Patent Publication No. 1,371,510 to Rotschild Nominees Limited illustrates this treatment.

More recently, techniques have been developed for improving adhesion by depositing a layer of dendritic structures onto the metal or metal alloy foil. The dendritic structures serve to increase the surface area of the foil and thereby improve the bond which is primarily mechanical in nature. In most of these techniques, a nodular powdery copper layer, primarily copper or copper oxide particles, is electrodeposited onto the foil surface. Since the particles forming the dendritic layer tend to be powdery and loose, a second or locking layer is generally formed over the dendritic layer. This locking layer is typically a smooth deposit of copper or some other metal which conforms to the configuration of the dendritic layer. It function is to reduce the powder transfer characteristics of the dendritic layer and to maintain the configuration of the dendrites intact during the subsequent circuit fabrication operations. In some of these techniques, a preliminary cleaning step is performed on the metal or metal alloy foil before the dendrite forming operation. This preliminary cleaning step is generally intended to provide an oxide-free, degreased surface for treatment. Typical cleaning treatments include immersion in an alkaline cleaning solution or electrolytic degreasing in an alkaline solution. U.S. Pat. Nos. 3,220,897 to Conley et al., 3,293,109 to Luce et al., 3,322,656 to Dahringer et al., 3,328,275 to Waterbury, 3,518,168 to Byler et al., 3,585,010 to Luce et al., 3,699,018 to Carlson, 3,857,681 to Yates et al., 3,918,926 to Wolski et al., 4,049,481 to Morisaki, 4,053,370 to Yamashita et al. and Re. 30,180 to Wolski et al. exemplify these dendritic treatments.

Most recently, a technique has been developed for applying a dendritic copper treatment, referred to as a coral copper treatment in the art, to copper and copper alloy foils using a current having regularly recurring pulses. In this technique, the foil to be treated is immersed in a copper sulfate-sulfuric acid solution as a cathode. When the pulsed current is applied, copper dendrites are formed on the foil during a first portion of each pulse and are bonded to the foil surface during a second portion of each pulse. It has been discovered that this technique, illustrated in U.S. Pat. No. 4,468,293 to Polan et al., forms well-bonded dendritic structures that significantly improve the adhesion properties of copper or copper alloy foil.

One problem in this field that up to now has not been satisfactorily resolved involves the uneven plating of wrought foil by some of the current commercially available treatments. After some commercial coral copper treatments, the treated foil exhibits small bare spots, referred to as fish eyes in the industry, or unplated streaks where no dendritic structures have been deposited. These bare spots or unplated regions become zones of poor adhesion in the finished circuit board—a most undesirable condition, particularly with the current trend towards finer, narrower circuit lines and thinner foil. One approach for overcoming this problem has been suggested in co-pending U.S. patent application Ser. No. 670,236, filed on even date herewith, to Parthasarathi et al. In this approach, the number of bare spots or unplated regions on the treated foil is reduced by applying a light, substantially uniform layer of copper on the surface to be treated just prior to application of the dendritic treatment. It has been found that this copper layer renders the surface or surfaces to be treated more uniformly electrochemically active and consequently more receptive to the subsequent dendritic treatment.

The present invention relates to another technique which can be used to reduce the number of bare spots or unplated regions on metallic materials treated to improve their adhesive properties. In accordance with the present invention, the adhesive properties of metal or metal alloy sheet, strip or foil are improved by first forming a substantially uniform layer of metal oxide on each surface to be treated and thereafter chemically converting the oxide layer to a substantially uniform metal layer. Subsequent thereto, the sheet, strip or foil with the fresh metal layer is subjected to a dendritic treatment. The provision of a fresh metal layer on the surface or surfaces to be treated is believed to render the surface or surfaces more uniformly electrochemically active and more receptive to the dendritic treatment. This technique has particular utility in reducing the number of bare spots and/or unplated regions on wrought sheet, strip or foil. An apparatus for performing the technique of the present invention is also described.

In a preferred embodiment of the present invention, a wrought copper or copper alloy foil is treated by electrolytically forming a substantially uniform layer of cuprous oxide, having a thickness of about 0.01 to about 1.0 μm, on at least one surface of the foil. This cuprous oxide layer is preferably formed by immersing the copper or copper alloy foil in an aqueous alkaline cleaning solution and passing an anodic current through the foil. Alkaline solutions particularly suitable for forming the desired oxide layer include those that contain from about 3% to about 30% NaOH. After rinsing off residues such as NaOH, the foil is immersed in an acid solution, preferably a sulfuric acid solution. The cuprous oxide reacts with the acid to form a fresh, substantially uniform layer of copper on the foil. It is this fresh layer of copper that is believed to provide the improvements and advantages of the present invention. After formation of the copper layer, a plurality of dendrites are formed on the foil surface or surfaces, preferably by using an electrolytic technique such as that shown in the Polan et al patent to improve the adhesive properties of the foil.

It is an object of the present invention to provide a treatment for increasing the adhesion properties of metal and metal alloy materials.

It is a further object of the present invention to provide a treatment as above that reduces the number of bare spots and unplated streaks on the treated materials.

It is a further object of the present invention to provide an apparatus for performing the foregoing treatment.

These and other objects, features and advantages will become more apparent from the following description and drawing in which like reference numerals depict like elements.

The FIGURE is a schematic representation of an apparatus for performing the treatment of the present invention.

In accordance with the present invention, a treatment for improving the adhesive properties of metal or metal alloy sheets, strips and foils, particularly those in wrought form, is provided. The treatment described herein provides improved adhesion properties by reducing the number of bare spots or unplated regions on the treated surfaces of the metal and metal alloy materials. The treated metal and metal alloy materials have been found to have particular utility in electrical and electronic applications.

While the present invention will be discussed in the context of treating copper and copper alloy materials, it should be recognized that the treatment of the present invention could be applied to other metals and metal alloys. Furthermore, while the treatment of the present invention is particularly advantageous for improving the adhesive properties of wrought or as rolled materials, it may also be used to treat electrodeposited materials.

Briefly, the treatment of the present invention comprises forming a substantially uniform oxide layer on the surface or surfaces to be treated, chemically changing the oxide layer to a substantially uniform layer of fresh metal on the surface or surfaces, and thereafter applying a dendritic structure forming treatment to the surface or surfaces. While good results can be obtained by forming an oxide layer having a thickness in the range of about 0.01 $\mu$m to about 1.0 $\mu$m, it is preferred to form an oxide layer having a thickness in the range of about 0.1 $\mu$m to about 0.3 $\mu$m on each surface to be treated. Because of the manner in which the oxide layer is formed, it is not necessary to clean/degrease the material prior to treatment.

Referring now to the FIGURE, copper or copper alloy sheet, strip, or foil 10 in a wrought or as rolled condition is payed off a reel not shown and immersed in an alkaline cleaning solution 12. When treating copper or copper alloy materials, the alkaline solution preferably comprises an aqueous NaOH solution containing from about 3% to about 30% NaOH. While the solution may have a temperature in the range from about room temperaature to about the boiling temperature of the solution, the solution temperature is preferably within the range of about 25° C. to about 60° C. When the solution 12 is used at a temperature other than room temperature, the tank 18 may be provided with any suitable temperature maintenance and control means (not shown) known in the art.

A substantially uniform layer of cuprous oxide having the desired thickness is preferably formed on each surface to be treated by passing an anodic current through the immersed foil. A current source 14 for supplying the current and one or more cathodes 16 immersed in the solution 12 may be provided in a known manner. The current source 14 may comprise any suitable current supply known in the art. Similarly, the cathode or cathodes 16 may be formed from any suitable metal or metal alloy known in the art. Suitable current densities for forming the oxide layer are those up to about 100 mA/cm$^2$. Preferably, a current density in the range of about 10 mA/cm$^2$ to about 40 mA/cm$^2$ is used to form the oxide layer. The exposure or deposition time required to produce the desired oxide layer is a function of the applied current density. Generally, the higher the current density, the lower the exposure time required. Suitable exposure times are those in the range of about 15 seconds to about 2 minutes, preferably from about 15 seconds to about 1 minute. As a result of the oxide layer forming treatment, the copper or copper alloy foil 10 tends to turn dark in color.

Before applying the next treatment, it is desirable to rinse off any excess NaOH from the foil 10. This may be done using any suitable washing apparatus 20 known in the art. For example, the apparatus 20 may comprise a water rinse through which the foil 10 and the newly formed oxide layer pass. After being washed, the foil 10 and its oxide layer may be dried using any suitable drying means (not shown) known in the art.

It is believed that the present treatment reduces the number of bare spots or unplated regions because a fresh metal layer is provided on each surface to be treated. The fresh metal layer is believed to render the surface more uniformly electrochemically active and more receptive to subsequent electrolytic treatments such as electrodepositing dendrites on the surface. To form the fresh metal layer, the foil 10 and the oxide layer formed thereon are preferably immersed in a mineral acid solution 22. A preferred mineral acid solution for treating copper and copper alloy materials comprises a sulfuric acid solution. The solution may be an aqueous sulfuric acid solution having a sulfuric acid concentration of at least about 0.1% or it may be a concentrated sulfuric acid solution. Preferably, the solution comprises an aqueous sulfuric acid having a sulfuric acid concentration in the range of about 1% to about 10%. When the copper or copper alloy foil 10 is immersed in such an acid solution, it reverts back to its pink color. This is due to the reaction of the cuprous oxide with the sulfuric acid. During this reaction, a part of the copper in the cuprous oxide goes into solution and a part of it is deposited as fresh copper on the foil surface. Since the cuprous oxide layer is substantially uniform, the fresh copper layer should also be substantially uniform.

While it is preferred to immerse the foil 10 in a mineral acid solution 22 at room temperature, a solution having a temperature other than room temperature may also be used. When a solution at another temperature is used, the tank 24 may be provided with suitable means not shown for maintaining the temperature of the solution at the desired level.

As soon as possible after the layer of fresh copper material has been formed on the surface or surfaces, the foil 10 is preferably subjected to an electrolytic dendritic deposition treatment. This is done to take advantage of the increased electrochemically active nature of the foil surface or surfaces. Although not necessary, the foil 10 may be subjected to a washing step between the copper layer forming procedure and the dendritic layer forming step if desired.

Any suitable dendritic treatment using any suitable apparatus known in the art such as electrochemical cell 26 may be used to form a plurality of dendritic structures on the foil surface or surfaces. A current source 28 for applying current densities in excess of the limiting current density for the solution 32 to the foil 10 may be provided. Since it is preferred to form the dendrites by applying a cathodic current to the foil, one or more anodes 30 may be immersed in the electrolyte solution 32. The anode or anodes 30 may be formed from any suitable material including but not limited to lead and lead alloys such as Pb-6%Sb. If necessary, the anode or anodes may be placed in a container not shown such as a polypropylene bag to prevent unwanted contaminants from entering the solution.

When the foil 10 is formed from a copper base material, it has been found to be desirable to use a $CuSO_4$—$H_2SO_4$ solution 32 to form the dendrites. The solution 32 should contain a concentration of copper sufficient to perform the process efficiently but below the level at which the copper precipitates out as copper sulfate. For a solution at room temperature, the copper concentration, preferably in the form of copper sulfate, should be in the range of about 15 g/l to about 60 g/l, most preferably in the range of about 10 g/l to about 40 g/l. The concentration of sulfuric acid in the solution should be less than that which causes the copper to precipitate out as copper sulfate. For a solution at room temperature, the sulfuric acid concentration is preferably in the range of about 10 g/l to about 100 g/l.

While it is preferred to form the dendrites from a solution 32 at room temperatures, it is possible to form the dendrites with a solution 32 at a temperature other than room temperature. When solutions at such temperatures are used, the cell 26 may be provided with means not shown for maintaining the solution temperature at the desired level. The temperature maintaining means may comprise any suitable temperature regulation device such as a cooling/heating loop known in the art. Of course, the copper and sulfuric acid concentrations discussed above are temperature dependent and may have to be adjusted when the solution 32 is kept at a temperature other than room level. At solution temperatures higher than room temperature, the concentration of copper may be proportionately higher since the solubility limit of copper increases with temperature.

A preferred technique for forming the dendrites using a $CuSO_4$—$H_2SO_4$ solution and for bonding the dendrites to the foil surface(s) is described in U.S. Pat. No. 4,468,293 to Polan et al., which is hereby incorporated by reference.

After application of the dendritic treatment, the treated foil is preferably subjected to a washing operation to remove unwanted chemicals from the treated surface(s). Any suitable means 34 known in the art such as a water rinse may be used to wash the treated foil. After rinsing, it is desirable to dry the treated foil using any suitable means (not shown) known in the art.

If desired, the treated foil 10 may be subjected to an anti-tarnishing treatment after the rinse operation. Any conventional anti-tarnishing composition known in the art may be applied to the treated foil using any conventional apparatus 36 known in the art. For example, the treated foil may be immersed in a chronic acid solution.

After the treatment of the present invention has been completed, the treated foil 10 may be laminated to a substrate material such as a resinous or other synthetic polymer material. Any suitable lamination technique and/or adhesive known in the art may be used.

It has been found that by using an alkaline cleaning solution not only to degrease the material to be treated but to simultaneously form an oxide layer on it and thereafter convert the oxide layer to a layer of fresh metal, it is possible to increase the effectiveness of a subsequent dendritic treatment. This is evidenced by the fact that foil treated in accordance with the present invention has exhibited bare spots and unplated regions on less than 1% of the total foil surface area. As a result of this decrease in the number of bare spots/unplated regions, the adhesive properties of the treated material are noticeably improved.

If desired, the above described technique may be simplified by converting the copper oxide layer into the fresh metal layer in the same solution used to form the dendritic structures. For example, the desired fresh metal layer may be formed by immersing the foil 10 in the solution 32 without applying any electrical current for a period of time sufficient to convert the oxide layer into the fresh metal layer. The advantage of this approach is primarily economic. The need to prepare the solution 22 and to provide the tank 24 and the costs attendant thereto may be eliminated. Of course, where the metal layer is formed in the electrolyte solution used to form the dendrites, there is no need to subject the foil 10 to an intermediate washing step.

To demonstrate the present invention, the following examples were performed.

EXAMPLE I

A 2 oz./$ft^2$ copper alloy C11000 foil sample in an as rolled condition was immersed in an aqueous alkaline solution containing 10% NaOH at 60° C. A black oxide layer was formed on the foil by applying an anodic current having a current density of 20 mA/$cm^2$ for 60 seconds.

The foil was then immersed in an acid solution for 5 seconds to change the oxide layer to a layer of freshly deposited copper. The acid solution was at room temperature and had a copper concentration of 20 g/l and a sulfuric acid concentration of 45 g/l. After immersion in the acid solution, dendrites were formed on the foil by immersing the foil in the same acid solution and applying a fluctuating plating current having a frequency of about 20 Hz. for 9 seconds. The plating current had a 50% duty cycle with a peak current density of 240 mA/$cm^2$ and a minimum current density of 40 mA/$cm^2$.

The treated foil was found to be substantially uniformly plated with few or no unplated spots or streaks. The unplated spots/streaks covered less than 1% of the total foil surface.

EXAMPLE II

A 2 oz./ft$^2$ copper alloy C11000 foil sample was immersed in an aqueous alkaline solution containing 30% NaOH at 45° C. An anodic current having a current density of 40 mA/cm$^2$ was applied to the foil for 30 seconds. A dark oxide layer was formed on the foil surface. The foil was then subjected to immersion in the same acid solution as used in Example I for 5 seconds and to the same dendritic treatment as in Example I. Again, the treated foil exhibited uniformity in the plated layer and a substantial absence of plating defects. The number of bare spots and unplated regions again covered less than 1% of the total foil surface area.

While the invention has been mainly illustrated as treating a single surface of the foil, it is possible to treat more than one surface if so desired. When treating more than one surface, the cell 18 may be provided with a plurality of cathodes on opposed sides of the foil 10 and the cell 26 may be similarly provided with a plurality of anodes on opposed sides of the foil.

Any suitable means known in the art such as rollers may be used to pass the foil through the various electrochemical cells.

As previously mentioned, the present invention has greater applicability than just the treatment of copper and copper alloy foils. When applying the present invention to metal or metal alloy materials other than copper and copper alloys, the various operational parameters such as the composition of the solutions, the concentration of the metal to be deposited, the temperatures of the electrolyte solutions and the applied currents may be adjusted accordingly.

While it is preferred to electrolytically form the oxide layer, the oxide layer may also be formed non-electrolytically by immersion of the material to be treated in an alkaline cleaning solution for a time sufficient to create the desired oxide layer. Of course, the residence time needed to form such an oxide layer would be increased.

The U.S. patents, patent application and the foreign patent literature set forth in this specification are intended to be incorporated by reference herein.

It is apparent that there has been provided in accordance with this invention a preparation for improving the adhesion properties of metal foils which fully satisfies the objects, means and advantages set forth hereinbefore. While the invention has been described in combination with specific embodiments thereof, it is evident that many alternatives, modificatons and variations will be apparent to those skilled in the art in light of the foregoing description. Accordingly, it is intended to cover all such alternatives, modifications and variations as fall within the spirit and broad scope of the appended claims.

What is claimed:

1. A process for improving the adhesive properties of a metal or metal alloy material, said process comprising:
   forming a substantially uniform layer of metal oxide on at least one surface of said material;
   non-electrolytically converting the oxide layer into a substantially uniform layer of fresh metal on said at least one surface and thereby rendering said at least one surface more uniformly electrochemically active; and
   forming a plurality of dendritic structures on said at least one surface to improve said adhesive properties.

2. The process of claim 1 wherein said oxide layer forming step comprises:
   immersing said metal or metal alloy material in an alkaline cleaning solution.

3. The process of claim 2 wherein said immersing step comprises:
   immersing said metal or metal alloy material in an aqueous alkaline solution containing from about 3% to about 30% NaOH at a temperature in the range of about room temperature to about the boiling temperature of said alkaline solution.

4. The process of claim 2 wherein said immersing step comprises:
   immersing said metal or metal alloy material in an aqueous alkaline solution containing from about 8% to about 15% NaOH at a temperature in the range from about 25° C. to about 60° C.

5. The process of claim 2 wherein said oxide forming step further comprises:
   applying an anodic current to said metal or metal alloy material immersed in said alkaline solution.

6. The process of claim 5 wherein said current applying step comprises:
   applying a current having a current density less than about 100 mA/cm$^2$ to said metal or metal alloy material.

7. The process of claim 5 wherein said current applying step further comprises:
   applying a current having a current density in the range of about 10 mA/cm$^2$ to about 40 mA/cm$^2$ to said metal or metal alloy material.

8. The process of claim 1 wherein:
   said metal or metal alloy material comprises a copper or copper alloy foil in a wrought condition;
   said oxide layer forming step comprises forming a layer of cuprous oxide on said at least one surface; and
   said converting step comprises immersing said copper or copper alloy foil with said oxide layer in a mineral acid solution to form a substantially uniform layer of copper on said at least one surface.

9. The process of claim 8 wherein said dendrite forming step comprises:
   immersing said foil in an acid solution; and
   applying a cathodic current to said immersed foil.

10. The process of claim 9 further comprising:
    performing said converting and dendrite forming steps in the same acid solution.

11. The process of claim 1 further comprising:
    applying an anti-tarnishing treatment to said metal or metal alloy material.

12. The product formed by the process of claim 1.

13. An apparatus for improving the adhesive properties of a metal or metal alloy material, said apparatus comprising:
    means for forming a substantially uniform metal oxide layer on at least one surface of said material;
    means for non-electrolytically converting said oxide layer on said at least one surface to a substantially uniform fresh layer of metal and thereby rendering said at least one surface more uniformly electrochemically active; and
    means for forming a plurality of dendritic structures on said at least one surface to improve said adhesive properties.

14. The apparatus of claim 13 wherein said oxide forming means comprises:
    a tank containing an aqueous alkaline solution; and means for immersing said material in said alkaline solution.

15. The apparatus of claim 14 wherein said oxide forming means further comprises:
   means for applying an anodic current to said material immersed in said alkaline solution.

16. The apparatus of claim 13 wherein:
   said converting means comprises a tank containing an acid solution in which said material with said oxide layer is immersed.

17. The apparatus of claim 13 wherein said dendritic structure forming means comprises:
   a tank containing an acid electrolyte solution;
   means for immersing said material in said electrolyte solution; and
   means for applying a cathodic current to said immersed material.

18. The apparatus of claim 17 wherein:
   said tank, said electrolyte solution and said immersing means also comprise said converting means.

19. The apparatus of claim 13 further comprising:
   means for applying an anti-tarnishing treatment to said material after formation of said dendritic structures.

* * * * *